United States Patent
Parrini

Patent Number: 6,135,339
Date of Patent: Oct. 24, 2000

[54] ULTRASONIC TRANSDUCER WITH A FLANGE FOR MOUNTING ON AN ULTRASONIC WELDING DEVICE, IN PARTICULAR ON A WIRE BONDER

[75] Inventor: Lorenzo Parrini, Zürich, Switzerland

[73] Assignee: Esec SA, Cham, Switzerland

[21] Appl. No.: 09/232,016

[22] Filed: Jan. 14, 1999

[30] Foreign Application Priority Data

Jan. 26, 1998 [EP] European Pat. Off. ............. 98810063

[51] Int. Cl.⁷ ................ B23K 1/06; B23K 5/20; B23K 20/10; B23K 37/00
[52] U.S. Cl. .............. 228/1.1; 228/4.5; 228/110.1
[58] Field of Search ................ 228/4.5, 180.5, 228/110.1, 1.1; 156/73.1

[56] References Cited

U.S. PATENT DOCUMENTS

| | | | |
|---|---|---|---|
| Re. 34,615 | 5/1994 | Freeman | 348/95 |
| 2,891,179 | 6/1959 | Elmore | 310/26 |
| 3,337,941 | 8/1967 | Drop | 29/203 |
| 4,144,449 | 3/1979 | Funk et al. | 250/221 |
| 4,346,293 | 8/1982 | Fetzer | 250/222 R |
| 4,351,264 | 9/1982 | Flaum et al. | 118/203 |
| 4,378,134 | 3/1983 | Eddy | 308/3.5 |
| 4,383,359 | 5/1983 | Suzuki et al. | 29/712 |
| 4,584,047 | 4/1986 | Vanderpool et al. | 156/361 |
| 4,610,083 | 9/1986 | Campisi et al. | 29/832 |
| 4,615,093 | 10/1986 | Tews et al. | 29/407 |
| 5,150,423 | 9/1992 | Hoki | 382/8 |
| 5,157,734 | 10/1992 | Chen et al. | 382/8 |
| 5,180,093 | 1/1993 | Stansbury et al. | 228/1.1 |
| 5,191,693 | 3/1993 | Umetsu | 29/429 |
| 5,195,234 | 3/1993 | Pine et al. | 29/720 |
| 5,207,369 | 5/1993 | Haji et al. | 228/4.5 |
| 5,213,653 | 5/1993 | Akahori et al. | 156/584 |
| 5,248,362 | 9/1993 | Sissons | 156/205 |
| 5,249,239 | 9/1993 | Kida | 382/8 |
| 5,275,657 | 1/1994 | Duffy et al. | 118/224 |
| 5,278,634 | 1/1994 | Skunes et al. | 356/400 |

(List continued on next page.)

FOREIGN PATENT DOCUMENTS

| | | | |
|---|---|---|---|
| 0 236 225 | 9/1987 | European Pat. Off. | H05K 13/02 |
| 0 340 100 | 11/1989 | European Pat. Off. | G06K 19/06 |
| 0 462 596 A1 | 12/1991 | European Pat. Off. | H01L 21/00 |
| 0 476 577 A2 | 3/1992 | European Pat. Off. | H05K 13/00 |
| 0 647 943 A1 | 4/1995 | European Pat. Off. | G11C 5/00 |
| 0 649 719 A1 | 4/1995 | European Pat. Off. | B29C 45/14 |
| 0 682 321 A2 | 11/1995 | European Pat. Off. | G06K 19/077 |
| 2 548 857 | 7/1983 | France | H05K 3/00 |
| 28 34 836 | 8/1978 | Germany | H05K 13/00 |
| 29 39 102 | 9/1979 | Germany | B05C 01/08 |
| 34 24 323 A1 | 7/1984 | Germany | H05K 13/02 |
| 35 44 221 A1 | 12/1985 | Germany | H05K 13/04 |
| 37 36 563 A1 | 10/1987 | Germany | H05K 13/02 |
| 41 27 696 A1 | 8/1991 | Germany | H05K 13/02 |
| 359208846A | 11/1984 | Japan . | |
| 362271663A | 11/1987 | Japan . | |

(List continued on next page.)

OTHER PUBLICATIONS

Gore, et al., Fluxing Tool Incorporated Into Part Feeder; Specifically for Assembly of C–5 Chip Carriers, Motorola Inc., Technical Developments, vol 13, Jul. 1991, pp. 36–37.

*Primary Examiner*—Patrick Ryan
*Assistant Examiner*—Kiley Stoner
*Attorney, Agent, or Firm*—D'Alessandro & Ritchie

[57] ABSTRACT

The horn of an ultrasonic transducer is applied with ultrasonic waves from an ultrasonic converter in such a way that standing ultrasonic waves develop in the lengthwise direction of the horn. A flange is arranged on the horn at the location of a node of the ultrasonic waves. The length of the flange is so aptly dimensioned that standing ultrasonic waves develop in the flange, when it can freely oscillate, which also have nodes. Drill holes are attached in this node so that the ultrasonic transducer is attachable to an ultrasonic welding device, in particular a wire bonder, by means of screws.

11 Claims, 5 Drawing Sheets

U.S. PATENT DOCUMENTS

| | | | |
|---|---|---|---|
| 5,289,625 | 3/1994 | Umetsu et al. | 29/426.3 |
| 5,309,223 | 5/1994 | Konicek et al. | 356/375 |
| 5,311,304 | 5/1994 | Monno | 348/87 |
| 5,364,005 | 11/1994 | Whelan et al. | 228/1.1 |
| 5,368,216 | 11/1994 | Sakakura et al. | 228/1.1 |
| 5,380,099 | 1/1995 | Teramachi | 384/45 |
| 5,385,288 | 1/1995 | Kyomasu et al. | 228/1.1 |
| 5,400,497 | 3/1995 | Watanabe et al. | 29/705 |
| 5,415,693 | 5/1995 | Yoneda et al. | 118/664 |
| 5,459,794 | 10/1995 | Ninomiya et al. | 382/145 |
| 5,469,011 | 11/1995 | Safabakhsh | 310/325 |
| 5,475,919 | 12/1995 | Wu et al. | 29/841 |
| 5,486,733 | 1/1996 | Yamazaki et al. | 310/323 |
| 5,488,771 | 2/1996 | Devitt et al. | 29/898.02 |
| 5,499,756 | 3/1996 | Banerji et al. | 228/214 |
| 5,515,600 | 5/1996 | Iwasaki et al. | 29/740 |
| 5,540,807 | 7/1996 | Akiike et al. | 156/580.1 |
| 5,547,537 | 8/1996 | Reynolds et al. | 156/351 |
| 5,559,727 | 9/1996 | Deley et al. | 364/559 |
| 5,564,188 | 10/1996 | Akasako et al. | 29/898.03 |
| 5,592,562 | 1/1997 | Rooks | 382/150 |
| 5,595,328 | 1/1997 | Safabakhsh et al. | 228/1.1 |
| 5,603,445 | 2/1997 | Hill et al. | 228/4.5 |
| 5,650,081 | 7/1997 | Hudson | 219/229 |
| 5,669,970 | 9/1997 | Balog et al. | 118/213 |
| 5,708,419 | 1/1998 | Isaacson et al. | 340/572 |
| 5,715,594 | 2/1998 | Patterson et al. | 29/842 |
| 5,735,040 | 4/1998 | Ochi et al. | 29/841 |
| 5,788,379 | 8/1998 | Reeve | 384/41 |
| 5,810,859 | 9/1998 | DiMatteo et al. | 606/169 |
| 5,829,689 | 11/1998 | Tadao et al. | 239/750 |
| 6,031,242 | 2/2000 | Hudson | 250/548 |

FOREIGN PATENT DOCUMENTS

| | | | |
|---|---|---|---|
| 2-303751 | 12/1990 | Japan | B23Q 15/22 |
| 3-008655 A | 1/1991 | Japan | B65H 26/00 |
| 3-133763 A | 6/1991 | Japan | B65D 73/02 |
| 5-145283 A | 6/1993 | Japan | H05K 13/02 |
| 6-089910 | 3/1994 | Japan | H01L 21/52 |
| 406163648A | 6/1994 | Japan . | |
| 406283578A | 10/1994 | Japan . | |
| 8-340175 | 12/1996 | Japan | H05K 3/34 |
| 9-064094 | 3/1997 | Japan | H01L 21/60 |
| 409213732A | 8/1997 | Japan . | |
| 411121546A | 4/1999 | Japan . | |
| 676703 A5 | 2/1988 | Switzerland | B65H 21/00 |
| 2 111 863 A | 12/1981 | United Kingdom | B05B 13/00 |
| 2 183 820 A | 6/1987 | United Kingdom | G05D 3/10 |

ULTRASONIC TRANSDUCER WITH A FLANGE FOR MOUNTING ON AN ULTRASONIC WELDING DEVICE, IN PARTICULAR ON A WIRE BONDER

PRIORITY CLAIM

The present application claims priority under 35 U.S.C. § 119 based upon European application no. 98810063.2, filed Jan. 26, 1998.

BACKGROUND OF THE INVENTION

The invention is related to an ultrasonic transducer with a flange. Such ultrasonic transducers are used for all types of ultrasonic welding devices, for example wire bonders. Ultrasonic transducers of this type are generally known from U.S. Pat. Nos. 5,603,445, 5,595,328 and 5,364,005. To mount the ultrasonic transducer on the ultrasonic welding device, a flange is provided which is attached in a so-called longitudinal node of the longitudinal standing ultrasonic waves excited in the horn of the ultrasonic transducer. However, antinodes from radial oscillations occur in a node of the longitudinal ultrasonic waves, and therefore the flange is only connected to the horn by means of webs in order to prevent as much as possible the transmission of ultrasonic energy from the horn to the flange and on to the ultrasonic welding device. From the energetics point of view, the transmission of ultrasonic energy could be quite acceptable. Much graver disadvantages, however, can be seen in that the electrical impedance of the ultrasonic transducer is not reproducible and not constant and that the way in which the tip of the horn oscillates, even with energetic insignificant transmission of ultrasonic energy from the horn to the welding device, is still dependent on various circumstances, e.g., on how strongly the screws are tightened which secure the flange to the welding device. The oscillations of the tip of the horn are also dependent on how as capillary is secured to the horn as can be taken, for example, from U.S. Pat. Nos. 5,180,093 and 5,368,216.

The object of the invention is to propose an ultrasonic transducer with a flange for mounting on an ultrasonic welding device with which the above-mentioned disadvantages are overcome. A further object is to form the horn of the ultrasonic transducer in such a way that its tip carries out controllable oscillations even on the application of high frequency ultrasonic waves.

BRIEF DESCRIPTION OF THE INVENTION

According to the invention, the object is resolved in that the linear dimensions of the flange are aptly proportioned so that standing radial ultrasonic waves develop in the flange which have at least one node. Such a node is described hereinafter as a radial node. The drill holes for mounting the flange on the ultrasonic welding device, e.g., on a Wire Bonder, by means of screws are arranged in this node. The surface immediately surrounding the drill holes which is in direct contact with the ultrasonic welding device therefore hardly resonates and no or only minimum transmission of ultrasonic energy takes place from the horn to the ultrasonic welding device via the flange. The ultrasonic transducer and the ultrasonic welding device are therefore mechanically completely decoupled. The remaining ultrasonic energy which is transmitted from the horn to the ultrasonic welding device is negligibly small.

BRIEF DESCRIPTION OF THE DRAWING FIGURES

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

Figure 1A:
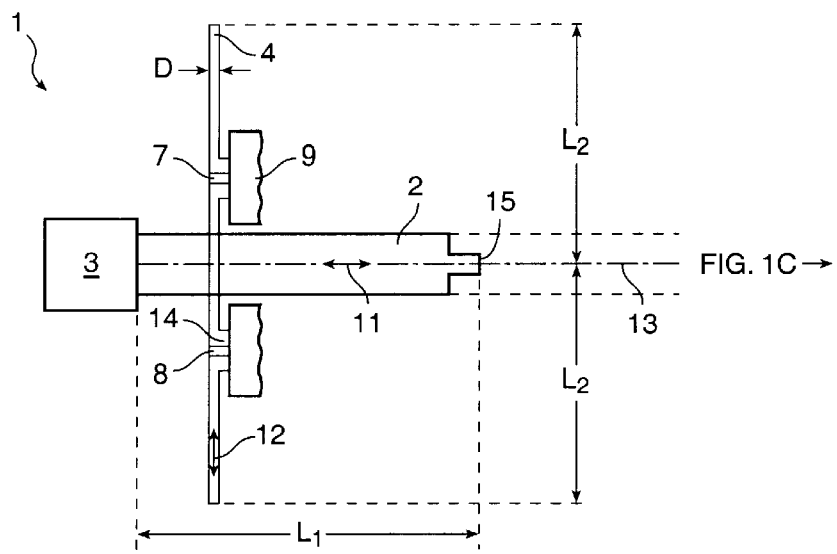
FIG. 1a is a diagram illustrating an ultrasonic transducer with a flange in plan view.

FIG. 1a a diagram illustrating the plan view of an ultrasonic transducer 1 with an oblong horn 2 and an ultrasonic converter 3 which applies ultrasonic waves to the horn 2. In the lengthwise direction of the horn 2, standing ultrasonic waves develop on excitement of the horn 2 with a resonance frequency by the ultrasonic converter 3. The ultrasonic waves have so-called longitudinal nodes 5 (FIG. 1b) as well as antinodes 6 whose position and number depend on the length L1 of the horn 2, the sound velocity of the ultrasonic waves in the horn material 2 and on the frequency of the ultrasonic waves generated by the ultrasonic converter 3.

Figure 1B:
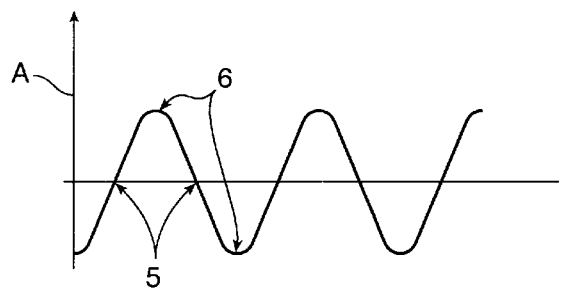
FIG. 1b is a diagram illustrating the amplitude of the standing ultrasonic waves which develop in the horn of the ultrasonic transducer on excitement by a predetermined resonance frequency.
Figure 1C:
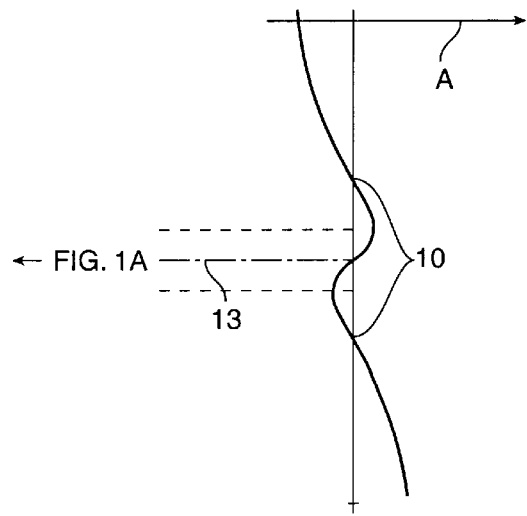
FIG. 1c is a diagram illustrating the amplitude of the standing ultrasonic waves which develop in the flange on excitement by a predetermined resonance frequency.

FIG. 1*b* is a diagram illustrating the amplitude A of the ultrasonic waves along the horn 2 on excitement of the horn 2 by the ultrasonic converter 3 with a predetermined resonance frequency fR. The resonance frequency fR is, e.g., around 124 kHz, selected so high that five longitudinal nodes 5 develop along the horn 2. The flange 4 (as seen in FIG. 1*a*) is arranged on the horn 2 at the location of the second node 5 of the ultrasonic waves. The flange 4 and the horn 2 may be manufactured as one part. The flange 4 is formed symmetrically in relation to the longitudinal axis of the horn 2 and has a drill hole 7 or 8 on both sides of the horn 2 so that the ultrasonic transducer 1 can be mounted on an ultrasonic welding device 9, e.g., on a Wire Bonder by means of screws. Radially aligned ultrasonic waves expand in the flange 4. The length L2 of the flange 4 is now dimensioned in accordance with the invention in such a way that, on application of the resonance frequency fR to the horn 2, standing ultrasonic waves also develop in the flange 4 which has at least one node 10 (FIG. 1*c*). These nodes 10 are called radial nodes. The drill holes 7 and 8 are arranged in these nodes 10. The direction of oscillation of the ultrasonic waves in the horn 2 and in the flange 4 is presented with arrows 11 or 12. With longitudinal oscillation we mean an oscillation extending in the lengthwise direction of the horn 2, with radial oscillation we mean an oscillation extending transversely to the longitudinal axis of the horn 2. The length L2 is measured from the axis of symmetry 13 of the horn 2 up to the tip of the flange 4.

It is of advantage, as shown in FIG. 1*a*, when the flange 4 is formed somewhat thicker in the area of the drill holes 7, 8. Thereby, only the surfaces 14 of the flange 4 which immediately surround the drill holes 7, 8 come in contact with the ultrasonic welding device 9. In ultrasonic terms, the ultrasonic transducer 1 is completely decoupled from the ultrasonic welding device 9 and therefore can freely oscillate practically without friction on the ultrasonic welding device 9. A solution is also possible with which the flange 4 is realized with a constant thickness D. In this case, the contact surface of the ultrasonic welding device 9 touching the flange 4 should be correspondingly small.

Figure 2A:
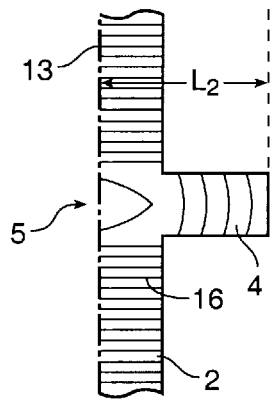
FIG. 2a is a diagram illustrating a horn and a freely oscillating conventional type flange.
Figure 2B:
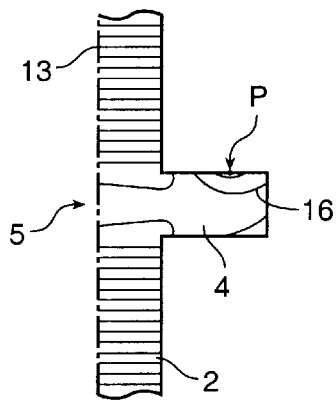
FIG. 2b is a diagram illustrating the flange of FIG. 2a when it is fixed at point P.
Figure 2C:
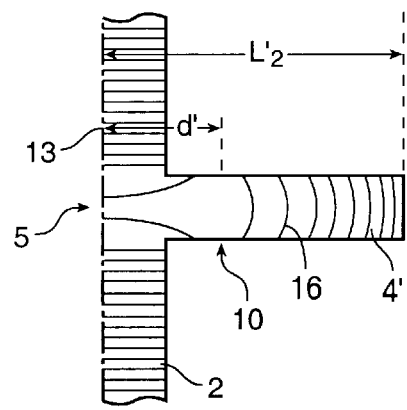
FIG. 2c is a diagram illustrating a horn and a flange according to a preferred embodiment of the present invention.
Figure 4A:
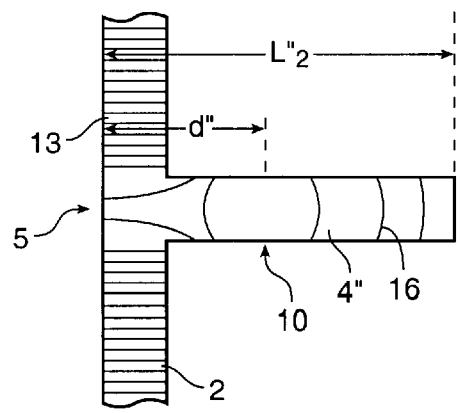
FIG. 4a is a diagram illustrating a freely oscillating flange with drill holes located at preset positions in which a radial node develops in the immediate vicinity of a drill holes according to a preferred embodiment of the present invention.

FIGS. 2*a*–*c* and later FIGS. 4*a* and *b* show results of mathematical calculations whereby lines 16 are drawn whose distance is proportional to the local oscillation amplitude of the ultrasonic waves. A smaller distance means that the corresponding area oscillates comparatively strongly while a larger distance means that the corresponding area oscillates comparatively little or is even completely still.

FIG. 2*a* is a diagram illustrating a horn 2 and a freely oscillating conventional type flange 4 mounted in one of the longitudinal nodes 5 of the horn 2, i.e., a flange with relatively short length L2, which can oscillate freely, whereby the horn 2 is envisaged as a horn for a Wire Bonder. The conventional flange 4 has a length L2=9 mm. For reasons of symmetry, only the side of the flange 4 which contains the drill hole 8 on the right in relation to the axis of symmetry 13 of the horn 2 is drawn. The horn 2 is excited with the predetermined resonance frequency fR from the ultrasonic converter 3 (FIG. 1*a*) so that longitudinal standing ultrasonic waves develop in the lengthwise direction. Because its length L2 is too short, no radial node can develop in the flange 4 with the frequency fR. FIG. 2*b* shows the same flange 4, for which a mathematical point P is fixed in the center of drill hole 8 (FIG. 1*a*). From FIGS. 2*a* and *b* it can be seen, that the oscillating behavior of the conventional flange 4 is strongly dependent on whether the flange 4 can oscillate freely or whether it is fixed at point P. In practice, the position of point P varies as a result of unavoidable tolerances which has the result that the actual position at which the screws press the flange 4 against the ultrasonic welding device 9 and the actual force which they thereby exert locally on the flange 4, influence the oscillations of the tip 15 of the horn 2 to an undesirable extent. The oscillations of the tip 15 of the horn 2 are thereby not reproducible. As forces occur in the point P, a part of the ultrasonic energy is also lost through friction at the attachment point P.

FIG. 2*c* is a diagram illustrating a horn 2 and flange' in accordance with a preferred embodiment of the present invention, i.e., a flange with relatively large length L2', which may oscillate freely. The example calculation resulted in the optimum length L2'=16 mm. When the horn 2 is excited by the selected resonance frequency fR, radial ultrasonic waves develop in the flange' which also have a node 10. The node 10 is located at a distance d'=5 mm from the axis of symmetry 13 of the horn 2. When the drill holes 7, 8 for attachment of the ultrasonic transducer 1 are mounted in this node 10, the oscillating behavior of the horn 2 does not change when the ultrasonic transducer 1 is mounted on the ultrasonic welding device 9. The horn 2 and the ultrasonic welding device 9 can therefore be completely mechanically decoupled so that the oscillations of the tip 15 of the horn 2 are no longer dependent on whether and with which force the flange' is secured to the ultrasonic welding device 9.

Figure 3A:
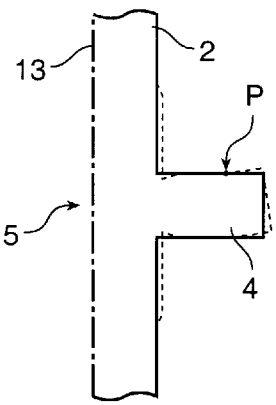
FIG. 3a is a diagram illustrating the oscillation amplitude of the horn and flange of FIG. 2a if the flange is fixed at point P.
Figure 3B:
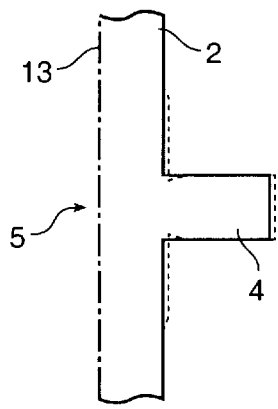
FIG. 3b is a diagram illustrating the oscillation amplitude of the horn and flange of FIG. 2a if the flange is not fixed at point P.

FIG. 3*a* is a diagram illustrating the oscillation amplitude of the horn and flange of FIG. 2*a* if the flange is fixed at point P. This shows a further disadvantage of the conventional flange 4. When the flange 4 is fixed at point P, it bends on the application of ultrasonic waves to the horn 2. As a comparison, FIG. 3*b* presents the freely oscillating conventional flange 4, which does not bend. The extended edge lines show the resting position of the horn 2 or flange 4. The dashed edge line shows the horn 2 or the flange 4 in the state of maximum oscillation amplitude. The deflection of the tip of the flange 4 is in phase with the deflection of the horn 2 at node 5 in radial direction. These bending oscillations lead, on the one hand, to the flange 4 vibrating on the ultrasonic welding device 9 and, on the other hand, to undesirable bending oscillations occurring in the horn 2 because of the reaction. The oscillations of the tip 15 of the horn 2 are not reproducible as the strength of the bending oscillations of the horn 2 can be dependent on the force with which the screws press the flange 4 against the ultrasonic welding device 9. With the flange' in accordance with the invention, no bending occurs at point P.

The simulations show that the resonance frequency fR and therefore the position of the longitudinal node 5 (FIG. 1*b*) vary slightly as a function of the length L2' of the flange' in accordance with a preferred embodiment of the present invention. It is therefore advisable to adjust the position of the flange' by the position shift of the node 5 and in this way to iteratively optimize the position and length L2'.

Figure 4B:
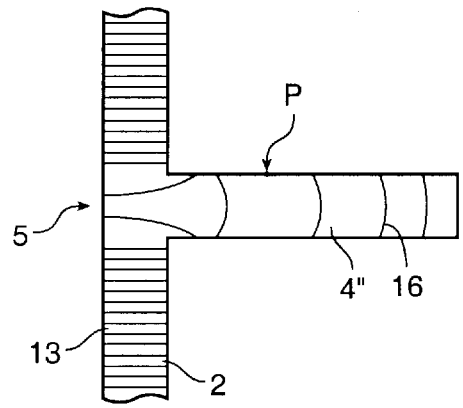
FIG. 4b is a diagram illustrating the flange of FIG. 4a when it is fixed at a point P at the location of the drill holes according to a preferred embodiment of the present invention.

In order to be able to retrofit existing Wire Bonders with an ultrasonic transducer 1 with such a flange without having to carry out mechanical changes to the Wire Bonder, the position of drill holes 7, 8 must not be altered, i.e., their distance d" from the axis of symmetry 13 of the horn 2 is firmly preset. The length L2" of the flange is therefore, according to the invention, to be dimensioned in such a way that node 10 develops as far as possible at the location of the drill hole 7 or 8 under the prerequisite that the flange can oscillate freely. FIG. 4a shows another freely oscillating flange 4", in which a radial node 10 develops in the immediate vicinity of drill hole 7. The example calculation resulted in an optimum length L2"=18 mm for the distance d"=7 mm of drill holes 7, 8 from the axis of symmetry 13 of the horn 2. FIG. 4b shows the other flange 4", for which a mathematical point P is now fixed at the preset location of drill hole 7. From FIG. 4a and 4b it can be seen that the solution with the length L2"=18 mm is a practicable solution with which the oscillating behavior of the flange 4" is also hardly dependent on whether the flange 4" can oscillate freely or whether it is fixed at point P.

Figure 5A:
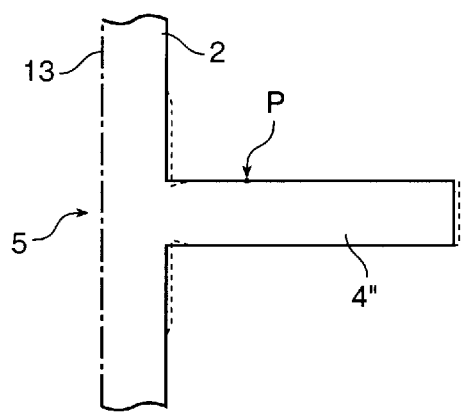
FIG. 5a is a diagram illustrating the oscillation amplitude of the horn and flange of FIG. 4b if the flange is fixed at point P according to a preferred embodiment of the present invention.
Figure 5B:
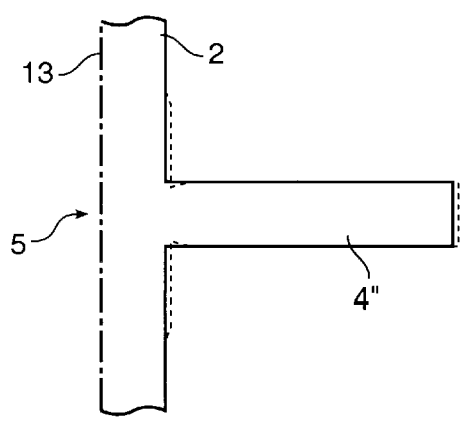
FIG. 5b is a diagram illustrating the oscillation amplitude of the horn and flange of FIG. 4b if the flange is not fixed at point P according to a preferred embodiment of the present invention.

FIGS. 5a and 5b show that the other flange 4" fixed at point P and secured according to a preferred embodiment of the present invention (FIG. 5a) does not bend on application of ultrasonic waves to the horn 2 and that it oscillates very similarly to the freely oscillating flange 4" (FIG. 5b). The deflection of the tip of the flange 4 here is in phase opposition to the deflection of the horn 2 at node 5 in radial direction.

The invention can also be applied for other types of horns, e.g., for a horn formed symmetrically in relation to its longitudinal axis such as is, for example, shown in U.S. Pat. No. 5,469,011. The flange 4' in accordance with a preferred embodiment of the present invention can also be arranged on the ultrasonic converter 3 instead of on the horn 2. It must be noted thereby, that in the widest sense, under the term horn a fixture for the ultrasonic generating elements (e.g., of piezoelectric or magnetostrictive materials) is also meant, i.e., in this case ultrasonic converter 3 and horn 2 (FIG. 1a) form one single part.

Figure 9:
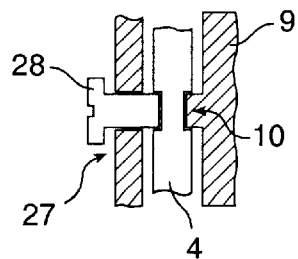
FIG. 9 is a diagram illustrating a flange which is fastened to an ultrasonic welding device by means of a clamp at the nodes according to another embodiment of the present invention.

In the exemplary embodiment as shown so far the flange 4 is mounted by means of screws on the ultrasonic welding device 9. Therefore the flange 4 has drill holes 7 and 8 which are arranged at the position of the nodes 10. Principally also other ways of fastening are possible wherein the flange does not have drill holes but is fastened to the ultrasonic welding device 9 by means of clamping means attacking at the nodes 10. With such a solution the flange 4 preferably comprises a nut into which the fastening means and/or the counterpart of the ultrasonic welding device 9 engages. FIG. 9 discloses such an example. A screw 28 engaging into the nut 27 serves as clamping means, the screw exerting pressure on the flange 4 at the position of the node 10.

Figure 6:
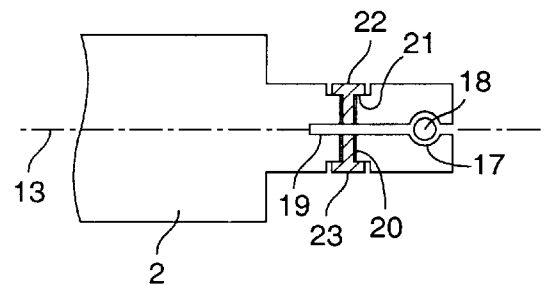
FIG. 6 is a diagram illustrating the tip of a horn according to a presently preferred embodiment of the present invention.

FIG. 6 is a diagram illustrating the tip of a horn according to a preferred embodiment of the present invention. The horn is formed symmetrically in relation to its longitudinal axis, therefore possessing the axis of symmetry 13. The horn 2 contains a drill hole 17 for acceptance of a capillary 18. The drill hole 17 is connected to a slit 19 running in the lengthwise direction of the horn 2. A further drill hole 20 penetrating the slit 19 is arranged transversely to the axis of symmetry 13 of the horn 2. The drill hole 20 ends on both sides in cavities 21 in the horn 2. Both cavities 21 are also formed symmetrically to one another. The cavities 21 at least partly accept the head of a screw 22 inserted into the drill hole 20 or of a nut 23 in combination with the screw 22. The head of the screw 22, the length of the screw 22 and the size of the nut 23 are adapted to each other in such a way that the mass of the head of the screw 22 and the mass of the nut 23 together with the mass of the end of the screw located outside the nut have almost the same value. This distribution of masses from screw 22 and nut 23 in relation to the axis of symmetry 13 of the horn 2 leads to a symmetrical development of the ultrasonic waves in relation to the longitudinal axis and therefore an optimum movement of the capillary 18. The cavity 21 accepting the nut 23 is so advantageously adapted to the nut 23 in shape and diameter that the nut 23 inserted into the cavity 21 can no longer turn.

Figure 7:
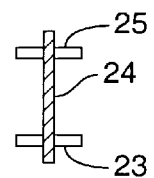
FIG. 7 is a diagram illustrating a fixture that may be used instead of a screw and a nut according to a preferred embodiment of the present invention.
Figure 8:
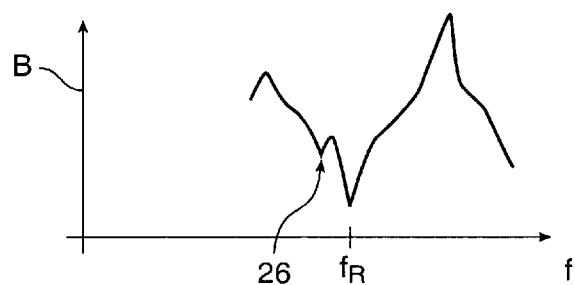
FIG. 8 is a diagram illustrating the modulus of electrical impedance of a mass distribution.

FIG. 7 shows a fixture which can be used instead of the screw 22 and the nut 23. The screw 22 with its head is replaced by a screw thread 24 and a second nut 25. This fixture enables a distribution of the masses of the screw thread 24 and the two nuts 23, 25 which is completely symmetrical to the longitudinal axis of the horn 2 in that, one or other of the nuts 23, 25 can be tightened on securing the capillary. The symmetry of the mass distribution can be checked metrologically in that the electrical impedance Z of the ultrasonic converter 3 is measured as a function of the frequency f of the ultrasonic waves generated by the ultrasonic converter 3. FIG. 8 shows the modulus B of impedance Z of such a spectrum. This has a spurious resonance 26 on unsymmetrical mass distribution of screw 22 and nut 23 or of screw thread 24 and the nuts 23, 25 in the vicinity of the desired resonance frequency fR of the longitudinal oscillations which belongs to a bend oscillation of the horn 2. The spurious resonance 26 can disturb the longitudinal oscillations of the tip 15 of the horn 2 in that it superimposes transverse oscillations on the longitudinal oscillations. On symmetrical mass distribution, the spurious resonance 26 disappears.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An ultrasonic transducer comprising a horn, a flange and an ultrasonic converter which excites the horn so that standing ultrasonic waves develop along a longitudinal direction of the horn and within the flange, the flange being arranged on the horn or on the ultrasonic converter at a location corresponding to a node of the standing ultrasonic waves, the flange having a length proportioned so that the standing ultrasonic waves developing within the flange have at least one node.

2. The ultrasonic transducer of claim 1, wherein the flange is in contact with an ultrasonic welding device only at a plurality of surfaces which immediately surround said at least one node.

3. The ultrasonic transducer of claim 1, further including a drill hole for fastening the flange to an ultrasonic welding device by means of screws, the drill hole located at said at least one node.

4. The ultrasonic transducer of claim 2, further including a drill hole for fastening the flange to said ultrasonic welding device by means of screws, the drill hole located at said at least one node.

5. The ultrasonic transducer of claim 1 wherein the horn has a first drill hole for acceptance of a capillary, wherein the capillary is secured by means of a screw inserted through a second drill hole in combination with a nut and wherein the distribution of the masses of the screw and the nut is symmetrical in relation to the longitudinal direction of the horn.

6. The ultrasonic transducer of claim 2 wherein the horn has a first drill hole for acceptance of a capillary, wherein the capillary is secured by means of a screw inserted through a second drill hole in combination with a nut and wherein the distribution of the masses of the screw and the nut is symmetrical in relation to the longitudinal direction of the horn.

7. The ultrasonic transducer of claim 3 wherein the horn has a first drill hole for acceptance of a capillary, wherein the capillary is secured by means of a screw inserted through a second drill hole in combination with a nut and wherein the distribution of the masses of the screw and the nut is symmetrical in relation to the longitudinal direction of the horn.

8. The ultrasonic transducer of claim 4 wherein the horn has a first drill hole for acceptance of a capillary, wherein the capillary is secured by means of a screw inserted through a second drill hole in combination with a nut and wherein the distribution of the masses of the screw and the nut is symmetrical in relation to the longitudinal direction of the horn.

9. The ultrasonic transducer of claim 1 wherein the flange is in contact with an ultrasonic wire bonder only at a plurality of surfaces which immediately surround said at least one node.

10. The ultrasonic transducer of claim 1 further including a drill hole located at said at least one node for fastening the flange to an ultrasonic wire bonder by means of at least one screw.

11. The ultrasonic transducer of claim 2 further including a drill hole located at said at least one node for fastening the flange to an ultrasonic wire bonder by means of at least one screw.

* * * * *